(12) United States Patent
Park et al.

(10) Patent No.: US 6,529,033 B1
(45) Date of Patent: Mar. 4, 2003

(54) AREA EFFICIENT CLOCK INVERTING CIRCUIT FOR DESIGN FOR TESTABILITY

(75) Inventors: Heonchul Park, Cupertino, CA (US); Arthur H. Ting, Fremont, CA (US)

(73) Assignee: Infineon Technologies North America Corp., San Jose, CA (US)

( * ) Notice: Subject to any disclaimer, the term of this patent is extended or adjusted under 35 U.S.C. 154(b) by 0 days.

(21) Appl. No.: 09/991,067

(22) Filed: Nov. 16, 2001

(51) Int. Cl.[7] .......................... H03K 19/00; G01R 31/28
(52) U.S. Cl. .......................... 326/16; 326/93; 714/726; 327/185
(58) Field of Search .................. 326/16, 93; 714/724, 714/726; 327/165, 185

(56) References Cited

U.S. PATENT DOCUMENTS

| 5,386,423 A | 1/1995 | Koo et al. |
| 6,189,128 B1 | 2/2001 | Asaka |
| 6,370,662 B2 * | 4/2002 | Hamidi ........................ 714/724 |

* cited by examiner

*Primary Examiner*—Daniel Chang
(74) *Attorney, Agent, or Firm*—Bever, Hoffman & Harms, LLP; Patrick T. Bever

(57) ABSTRACT

A method for fabricating IC devices including both rising edge-triggered circuits (e.g., flip-flops or latches) and falling edge-triggered circuits in which a clock signal line is selectively inverted by an on-chip clock signal inverting circuit and applied to one or the other circuit types during test modes. The clock signal inverting circuit is implemented as a two-input exclusive-OR gate, or using a multiplexer. The method includes placing and routing the selected circuit type (i.e., rising or falling edge) such that clock skew is minimized.

18 Claims, 5 Drawing Sheets

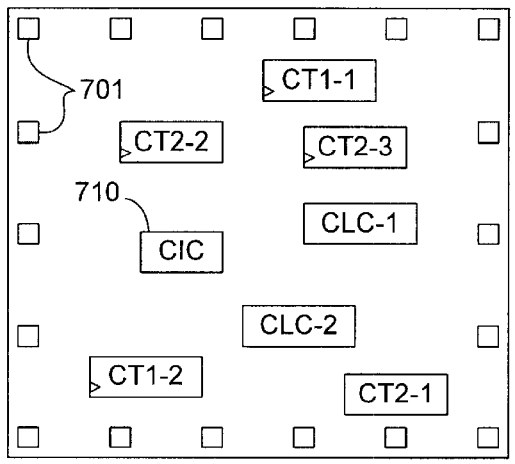
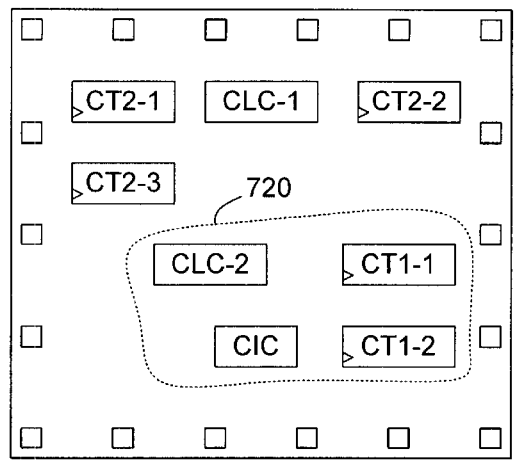
FIG. 7(A)　　　　　　　　FIG. 7(B)
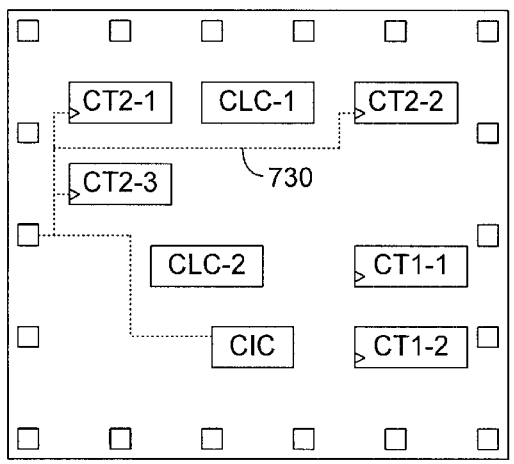
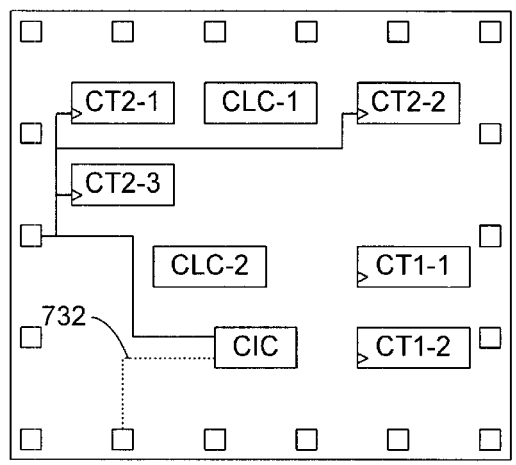
FIG. 7(C)　　　　　　　　FIG. 7(D)
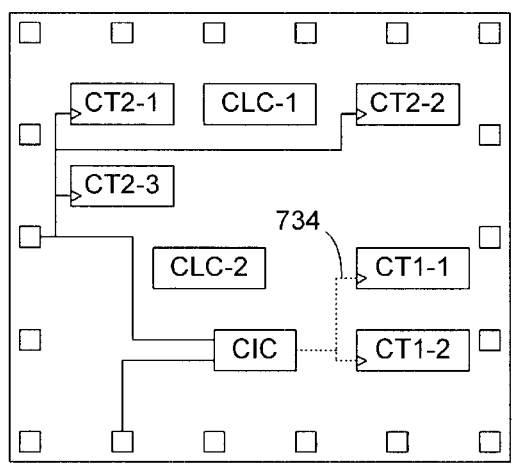
FIG. 7(E)

AREA EFFICIENT CLOCK INVERTING CIRCUIT FOR DESIGN FOR TESTABILITY

FIELD OF THE INVENTION

This invention relates to integrated circuits, and more particularly to integrated circuits including both rising edge-triggered circuits to a falling edge-triggered circuits.

BACKGROUND OF THE INVENTION

Modern Integrated Circuits (IC) fabrication processes have reduced the size of transistors such that hundreds of millions of transistors can be inexpensively fabricated on a single semiconductor wafer, or "chip". This capability has lead to an increased number of different functions performed on a single chip, giving rise to so-called System-On-a-Chip (SOC) devices. For example, a SOC device may include a micro controller (MCU), a digital signal processor (DSP), a reduced instruction set (RISC) processor, memory, and application specific logic circuitry combined on a single chip.

FIG. 1 is a flow diagram illustrating a simplified conventional process for designing and fabricating a SOC device 100. At the beginning of the design phase, a circuit designer typically selects an IC family that is defined, for example, by the fabrication process and chip size of the completed IC, along with any pre-defined arrangements of transistors and/or contact pads. The user then enters a logic design into a computer or workstation 110 using an input device 111. Computer 110 is loaded with a logic design entry software tool 113 that is typically linked to a design library 115 containing pre-defined circuit structures and design parameters associated with the selected IC family. Design library 115 also typically includes one or more pre-defined logic elements (often referred to as "macros") that can be selected by the user during the logic design entry process. The user utilizes entry tool 113 to link these pre-defined logic elements with custom-designed logic elements (if any) to construct the logic design. Once the logic design is entered, place and route tools 117, also loaded on computer 110, are utilized to generate a place-and-route solution, which arranges the various interrelated portions of the logic design in an efficient two-dimensional spatial relationship that can be fabricated on a chip, and generates signal lines (interconnect wires) for passing signals between the interrelated portions. A layout tool 119 is then utilized to construct a three-dimensional representation of the actual circuit structures (e.g., regions of doped semiconductor, insulated regions, and metal lines) needed to implement the logic design. The three-dimensional representation is then used to generate a set of masks (step 120) that are then used to fabricate IC device 100 (step 130) using known fabrication techniques.

As the number of transistors and functions performed on each chip increases, the possibility of device failure due to fabrication errors also increases. Accordingly, IC manufacturers typically utilize one or more device testing methodologies to test each fabricated device 100 prior to being sold to an end user.

Design-For-Testability (DFT) is one type of standard methodology utilized to test modern ICs, such as SOC device 100, before sale to an end user. Referring to the lower portion of FIG. 1, according to conventional DFT methodology, SOC device 100 is mounted onto a test fixture 140 such that the terminals (contact pads) of SOC device 100 are connected via corresponding wires to a testing station 150. Testing station 150 (e.g., a computer or workstation) stores one or more DFT software tools 155 that are utilized during testing. One such test performed using DFT tools 155 is referred to as "scan test", and includes shifting test data values into the device under test (step 142), causing the device under test to apply the test data to selected internal circuitry (step 144), and then shifting out the resulting test data (step 146). The resulting test data is then compared with expected result data to detect erroneous operation of the device under test. If the device under test passes all such testing, the device is then designated for sale to an end user. If the device fails this testing, it is typically discarded.

According to DFT methodology, test data values are serially shifted through a device under test using special ("scan") flip-flops arranged to form "scan paths". The scan paths are determined during the design phase of IC production (i.e., steps 113 and 117, discussed above), and include several scan flip-flops connected in series.

FIG. 2 is a simplified circuit diagram showing an IC device 200 including scan flip-flops FF-1 and FF-2, along with combinational logic circuitry (CLC-1 and CLC-2) and additional circuitry discussed below. Flip-flop FF-1 has a scan input TI connected to receive a TEST value, a data input terminal D for receiving a DATA value, a clock terminal (>) connected to receive a clock signal CLK1, a data output terminal Q, and a scan enable terminal TE connected to receive a mode control signal MC. Similarly, flip-flop FF-2 has a scan input TI connected to the output terminal of flip-flop FF-1 by a scan path portion 201, a data input terminal D connected to receive a data value from combinational logic circuit CLC-1, a clock terminal (>), a data output terminal Q, and a scan enable terminal TE connected to receive mode control signal MC. Scan flip-flops FF-1 and FF-2 are constructed to operate in either a test mode or a normal operation mode, which is determined by mode control signal MC. During the test mode (e.g., mode control signal MC is asserted), each scan flip-flop FF-1 and FF-2 stores test data received from a preceding scan flip-flop in a scan path, thereby allowing test data values to be shifted along the scan path. For example, during the test mode, flip-flop FF-2 registers (stores) the test value passed from flip-flop FF-1 to its scan input terminal TI on scan path portion 201. Accordingly, the scan paths are utilized to pass test data into a device under test during test data input (step 142), and also to pass resulting test data out of the device during subsequent data output procedures (step 146). During normal operations (e.g., mode control signal MC is de-asserted), the scan flip-flops receive and store data values applied to data input terminals D. For example, during normal operation, flip-flop FF-2 registers data values generated by logic circuit CRC-1.

Conventional DFT tools (such as DFT tool 155; see FIG. 1) are typically purchased by an IC manufacturer from a company that specializes in producing such tools. For example, third-party DFT tools are commercially available from Mentor Graphics of Wilsonville, Oreg., and Synopsis Inc. of Sunnyvale, Calif. Such DFT tools facilitate testing by providing a test clock signal (e.g., CLK-1 in FIG. 2) supplied to the scan flip-flops (and other clocked elements) of a device under test during the test mode, and input/output circuitry for transmitting test data to and resulting data from the device under test. A problem associated with these currently available DFT tools arises when an IC manufacturer's device includes both rising edge-triggered flip-flops and falling edge-triggered flip flops are utilized in an IC device. In particular, difficulties arise when a single clock signal is used to control both rising edge-triggered circuits and falling edge-triggered circuits during scan testing. For example, it both rising edge-triggered scan flip-flops and falling edge-triggered scan flip-flops are incorporated into the same scan path and driven by the same clock signal, then test data cannot be scanned (serially passed) using existing DFT tools. To circumvent this limitation of the DFT tools, IC manufacturers must devise test strategies that allow testing of the circuitry connected to both types of flip-flops.

Referring again to FIG. 2, simplified IC device 200 is modified according to one conventional method to facilitate testing both rising edge-triggered flip-flops (e.g., flip-flops FF-1 and FF-2) and falling edge-triggered flip-flops (e.g., FF-3) using conventional DFT tools. IC device 200 may include additional clocked circuits, such as high-level sensitive latch L-1 and low-level sensitive latch L-2.

To facilitate testing using a conventional DFT tool, IC device 200 incorporates two separate clock lines for transmitting two clock signals CLK-1 and CLK-2, respectively, that are supplied from an external source (i.e., tester 150 in FIG. 1) and applied to the rising edge-triggered circuits and falling edge-triggered circuits, respectively. Specifically, a first clock line 203 is utilized to transmit clock signal CLK-1 (through optional buffers B) to the clock terminals of flip-flops FF-1 and FF-2, and also to the clock terminal of latch L-1. Similarly, a second clock line 205 is utilized to transmit clock signal CLK-2 to the clock terminals of flip-flop FF-3 and latch L-2. Clock signals CLK-1 and CLK-2 are externally generated (e.g., by tester 150; see FIG. 1), and are applied to separate pins (contact pads) of IC device 200.

FIGS. 3(A) through 3(D) are timing diagrams depicting the clock signals CLK-1 and CLK-2 during normal and test modes in accordance with the conventional method. As shown in FIGS. 3(A) and 3(B), to facilitate testing using a conventional DFT tool, clock signal CLK-1 and clock signal CLK-2 are out of phase during the test mode, thereby causing the falling edge-triggered circuits (i.e., flip-flop FF-3 and latch L-2) to effectively operate as rising edge-triggered flip flops. During subsequent normal operation, as shown in FIGS. 3(C) and 3(D), clock signal CLK-1 and clock signal CLK-2 are in phase, thereby causing the falling edge-triggered circuits to operate normally.

There are several problems associated with the conventional method described above. For example, using two clock signals can produce relatively large clock skews and/or hold time problems due to the difficultly of generating separate clock signal lines during place and route. Also, additional cautions must be exercised during the design phase for signals that travel across clock domains (e.g., passing from a rising edge-triggered circuit to a falling edge-triggered circuit). Further, using two clock signals requires the use of a larger amount of chip space and/or slower chip operating speeds. Moreover, in comparison to single clock signal devices, the place and route process requires more routing space and additional clock tree circuits to support the multiple clock sources, which also contributes to the larger size and slower operating speeds of the device.

A second conventional approach utilizes a single clock signal, and provides clock signal inverting circuits that selectively invert the clock signal applied to selected flip-flops (e.g., all falling edge flip flops) of an IC device having both rising edge and falling edge flip-flops. The clock signal inverting circuits (e.g., multiplexers or exclusive-OR logic gates) are controlled by a mode control signal to pass either the clock signal or an inverted form of the clock signal to the selected flip-flops. Accordingly, the second conventional approach avoids the problems associated with utilizing two clock signals, but require a significant amount of chip space to support the multiple clock signal inverting circuits. Further, providing multiple clock signal inverting circuits greatly complicates clock skew management.

What is needed is a design methodology that facilitates the scan testing, using conventional DFT tools, of IC devices including both rising edge-triggered circuits to a falling edge-triggered circuits that minimizes clock signal skew and requires a minimum amount of chip area.

SUMMARY OF THE INVENTION

The present invention is directed to a method for fabricating IC devices including both rising edge-triggered circuits (e.g., flip-flops or latches) and falling edge-triggered circuits in which a clock signal line is selectively inverted by an on-chip clock signal inverting circuit during test modes. The normal (non-inverted) clock signal is routed, for example, to the rising edge-triggered flip-flops, and the selectively inverted clock signal is routed from the clock signal inverting circuit to, for example, the falling edge-triggered flip-flops. During the test mode, a test mode control signal causes the clock signal inverting circuit to invert the clock signal applied to the falling edge-triggered flip-flops, thereby causing the falling edge-triggered flip-flops to emulate rising edge-triggered flip-flops. By controlling the falling edge-triggered flip-flops using the on-chip clock signal inverting circuit, conventional DFT scan test tools can be utilized while minimizing the amount of clock signal skew and chip area needed to support both flip-flop types.

In accordance with a first specific embodiment of the present invention, the clock signal inverting circuit is implemented by a minimum number of logic gates (e.g., a two-input exclusive-OR (XOR) gate), thereby minimizing the amount of space required to generate the inverted clock signal during test modes. The mode control signal is routed to a first input terminal of the logic gate, and the clock signal is applied to a second input terminal of the logic gate. The output terminal of the logic gate is routed to, for example, the clock terminals of all falling edge-triggered flip-flops and latches of the integrated circuit.

In accordance with a second specific embodiment of the present invention, the clock signal inverting circuit is implemented by an inverter and a two-to-one multiplexer. The inverter is connected between the clock signal and a first data terminal of the multiplexer. The second data terminal of the multiplexer is connected to the (non-inverted) clock signal, and a select terminal of the multiplexer is connected to the mode control signal. During test operations, the mode control signal selects the inverted clock signal, which is passed to the falling edge-triggered circuits connected to the output terminal of the multiplexer. During normal operations, the mode control signal selects the (non-inverted) clock signal.

In accordance with a third embodiment of the present invention, a method for designing an integrated circuit including both rising edge and falling edge-triggered circuits includes arranging (placing) the integrated circuit components such that one type of clocked circuit (e.g., all falling edge-triggered circuits) are grouped together along with a clock signal inverting circuit, and routing a clock line from the clock signal inverting circuit to the clock terminals of each of the grouped circuits. The selected clocked circuits are grouped in a region of the integrated circuit area that minimizes clock skew between the clock signal inverting circuit and each selected clocked circuit. For example, the clock signal inverting circuit is placed such that a distance between the clock signal inverting circuit and each selected clocked circuit is minimized. Routing is performed such that a first wiring (clock signal) path is provided to each of the non-selected clocked circuits and to an input terminal of the clock signal inverting circuit. In addition, a second wiring path is provided for passing a mode control signal to a second input terminal of the clock signal inverting circuit, and a third wiring path is provided between an output terminal of the clock signal inverting circuit and the clock terminals of each of the selected clocked circuits. Accordingly, by grouping the selected clocked circuits to minimize clock skew (e.g., by placing the clock signal inverting circuit adjacent to the group), the selected clocked circuits can be controlled to emulate the non-selected clocked circuits during test mode operations, thereby allowing efficient DFT testing of integrated circuits including both rising and falling edge circuits using conventional DFT tools.

BRIEF DESCRIPTION OF THE DRAWINGS

These and other features, aspects and advantages of the present invention will become better understood with regard to the following description, appended claims, and accompanying drawings, where:

FIGS. 7(A), 7(B), 7(C), 7(D), and 7(E) are simplified diagrams depicting a placement and routing method for designing integrated circuits according to an embodiment of the present invention.

DETAILED DESCRIPTION OF THE DRAWINGS

Figure 1:
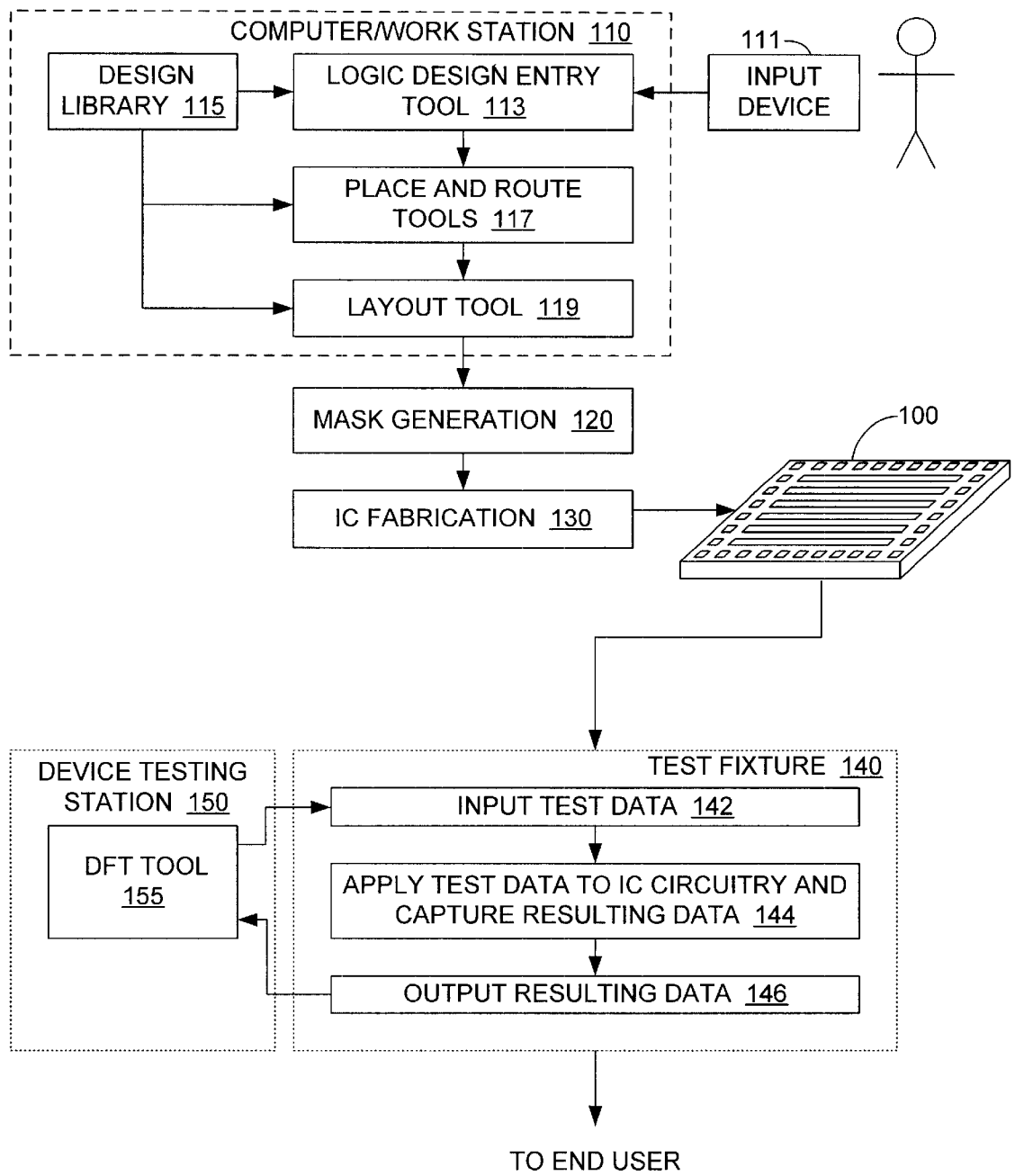
FIG. 1 is a diagram illustrating a conventional method of designing and testing an integrated circuit.
Figure 2:
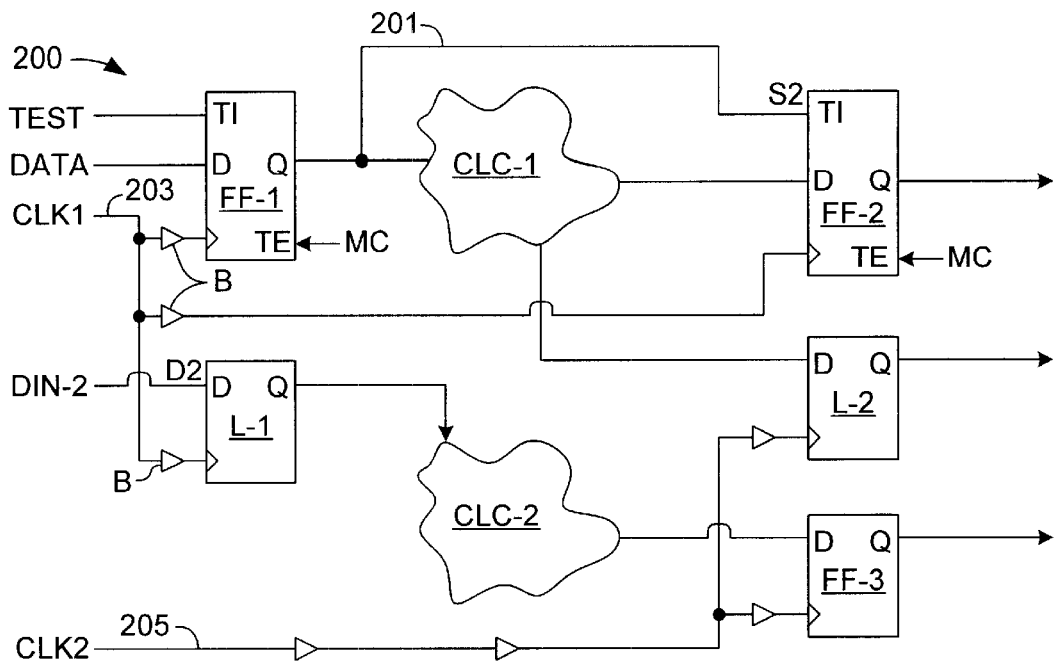
FIG. 2 is a simplified circuit diagram showing an integrated circuit including a conventional design for testability scheme.
Figure 4:
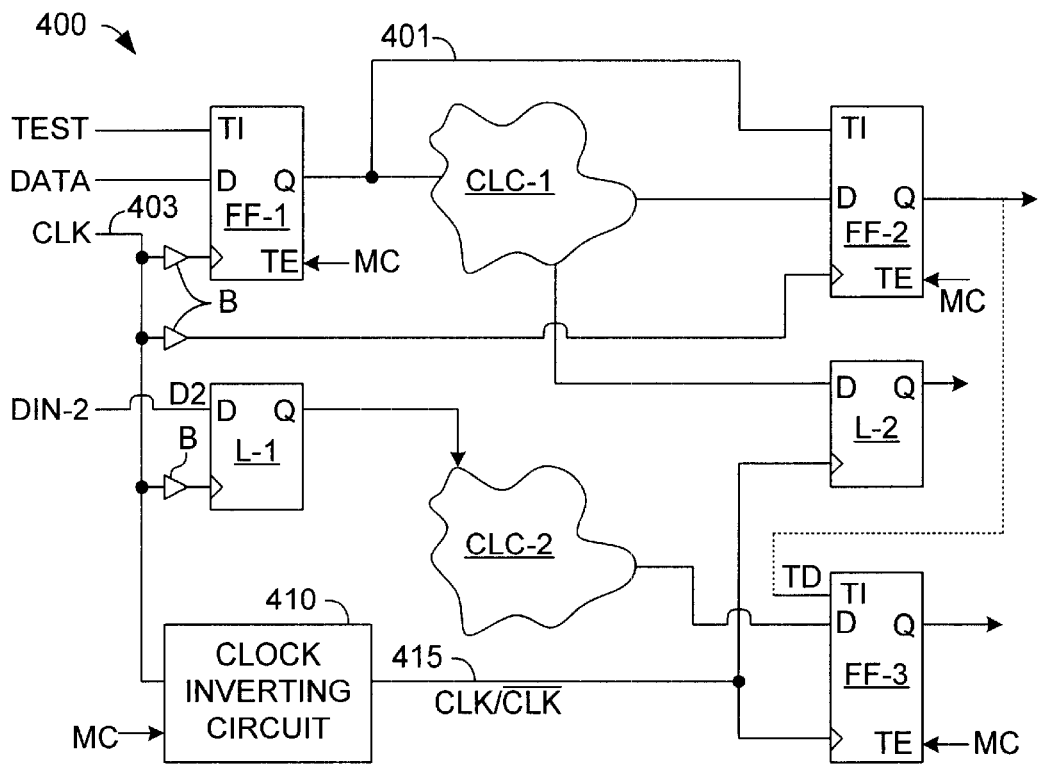
FIG. 4 is simplified circuit diagram showing an integrated circuit including a clock signal inverting circuit according to the present invention.
Figure 5A:
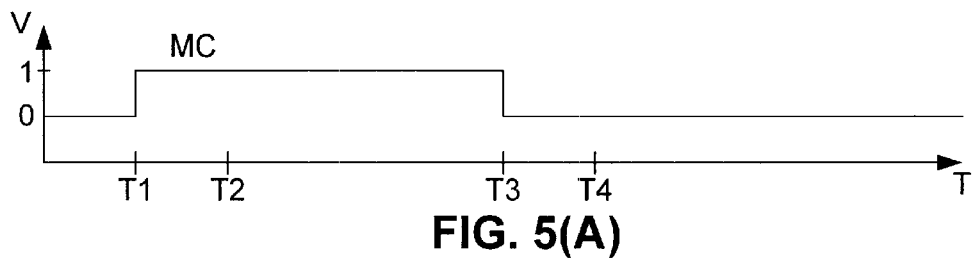
FIGS. 5(A), 5(B), and 5(C) are timing diagrams showing test mode and clock signals during operation of the integrated circuit of FIG. 4.
Figure 5B:
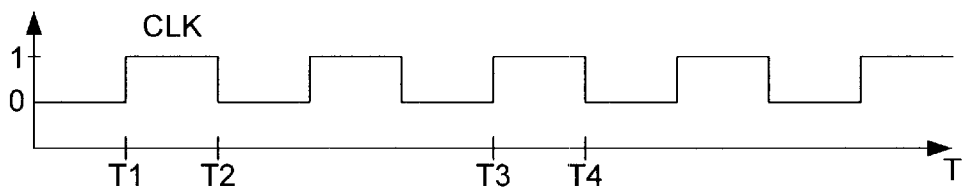
Figure 5C:
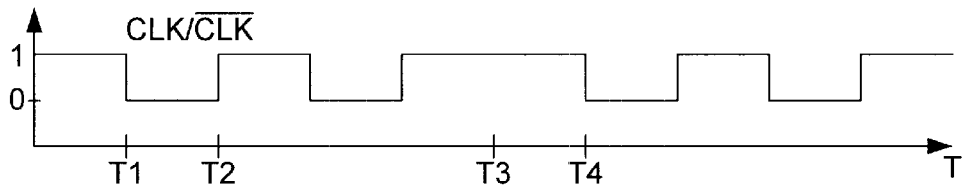

FIG. 4 is a simplified circuit diagram showing an IC device 400 formed in accordance with the present invention. Similar to conventional circuit 200 (described above with reference to FIG. 2), IC device 400 includes rising edge-triggered scan flip-flops FF-1 and FF-2, a high level sensitive latch L-1, and combinational logic circuitry CLC-1 and CLC-2. Flip-flop FF-1 has a scan input TI connected to receive a TEST value, a data input terminal D for receiving a DATA value, a clock terminal (>) connected to receive a clock signal CLK, a data output terminal Q, and a scan enable terminal TE connected to receive a mode control signal MC. Similarly, flip-flop FF-2 has a scan input TI connected to the output terminal of flip-flop FF-1 by a scan path portion 401, a data input terminal D connected to receive a data value from combinational logic circuit CLC-1, a clock terminal (>) connected to receive clock signal CLK, a data output terminal Q, and a scan enable terminal TE connected to receive mode control signal MC. As in the conventional circuit, scan flip-flops FF-1 and FF-2 are constructed to operate in either a test mode or a normal operation mode, which is determined by mode control signal MC. Also similar to conventional circuit 200, latch L-1 has a clock terminal connected to receive clock signal CLK and data input/output terminals connected between a data source (e.g., a pin or contact pad of IC device 400) and combinational logic circuit CLC-2. Combinational logic circuits CLC-1 and CLC-2 include non-clocked circuits (e.g., conventional logic gates) that generate data output values according to applied input data values.

In addition to the rising edge-triggered circuits (described above), IC device 400 includes an on-chip clock signal inverting circuit 410, a falling edge-triggered scan flip-flop FF-3, and a low level sensitive latch L-2. Clock signal inverting circuit 410 has a first input terminal connected to receive clock signal CLK, a second input terminal connected to receive mode control signal MC, and an output signal connected to the clock terminals of each falling edge-triggered circuit (e.g., scan flip-flop F-3 and latch L-2). Flip-flop FF-3 includes a data input terminal D for receiving a DATA value, a data output terminal Q, and a scan enable terminal TE connected to receive a mode control signal MC. In addition, scan flip-flop FF-3 has a scan input TI connected to receive a test data value TD from a preceding scan flip-flop in a scan chain including scan flip-flop FF-3. As indicated by the dashed line in FIG. 4, in one embodiment test data value TD is generated by scan flip-flop FF-2.

Figure 3A:
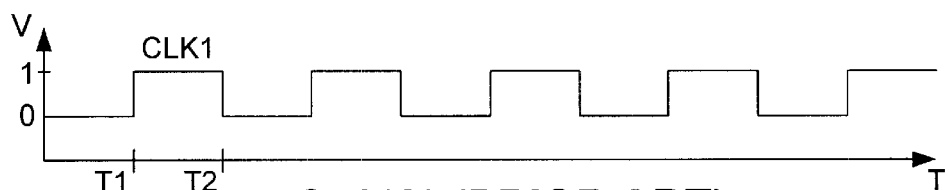
FIGS. 3(A), 3(B), 3(C), and 3(D) are timing diagrams showing clock signals utilized by the integrated circuit of FIG. 1 during test and normal operating modes.
Figure 3B:
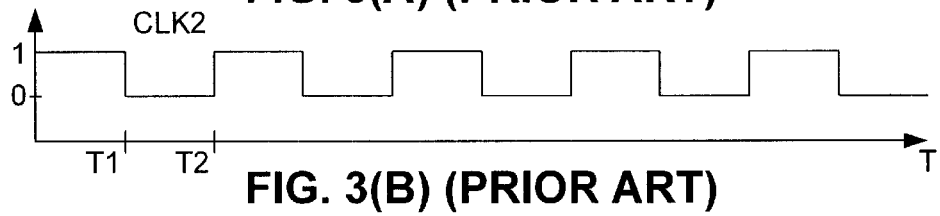
Figure 3C:
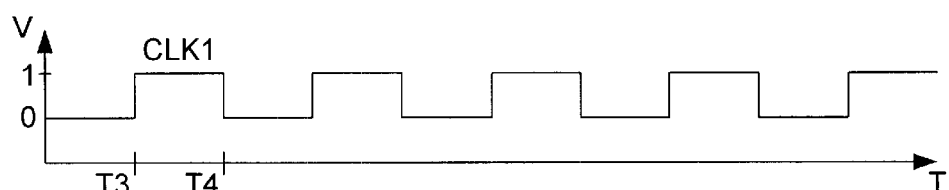
Figure 3D:
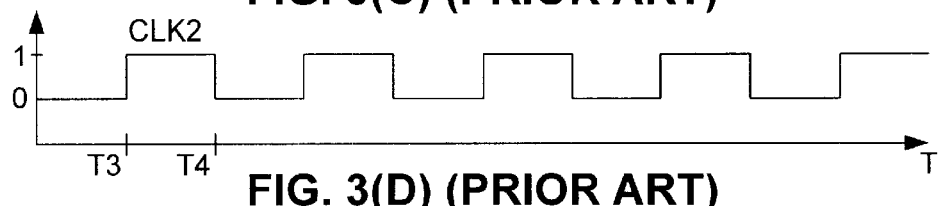

In accordance with an aspect of the present invention, clock signal inverting circuit 410 is placed in the same chip region as the falling edge-triggered circuits (e.g., flip-flop FF-3 and latch L-2) to minimize clock skew, and generates an output signal CLK/CLK-bar that is passed on a wiring segment 415 to the clock terminals of falling edge-triggered circuits. As indicated in FIGS. 3(A)–3(C), clock signal inverting circuit 410 is constructed such that, during scan test operations (i.e., when mode control signal MC is in a logic 1 or high state), output signal CLK/CLK-bar is the inverse of clock signal CLK. In particular, while the rising edge-triggered circuits (e.g., scan flip-flops F-1 and F-2) are driven by clock signal CLK, the falling edge-triggered circuits (e.g., F-3) are driven by an inverted clock signal, thereby causing the falling-edge-triggered circuits to emulate rising edge-triggered circuits. By causing all clocked circuits of IC device 400 to operate as rising edge-triggered circuits (or falling edge-triggered circuits), conventional DFT tools can be utilized to test a larger percentage of IC device 400 than is typically possible when both rising edge and falling edge-triggered circuits are combined in the same device because the same clock signal is used to clock both types of circuits and clock skew is minimized. Referring to the right sides of FIGS. 3(A)–3(C), during subsequent normal operating modes (i.e., when mode control signal MC is in a logic 0 or low state), output signal CLK/CLK-bar is essentially identical to clock signal CLK (i.e., clock signal CLK is in effect passed to the falling edge-triggered circuits), thereby allowing IC device 400 to operate as designed during normal operations.

Figure 6A:
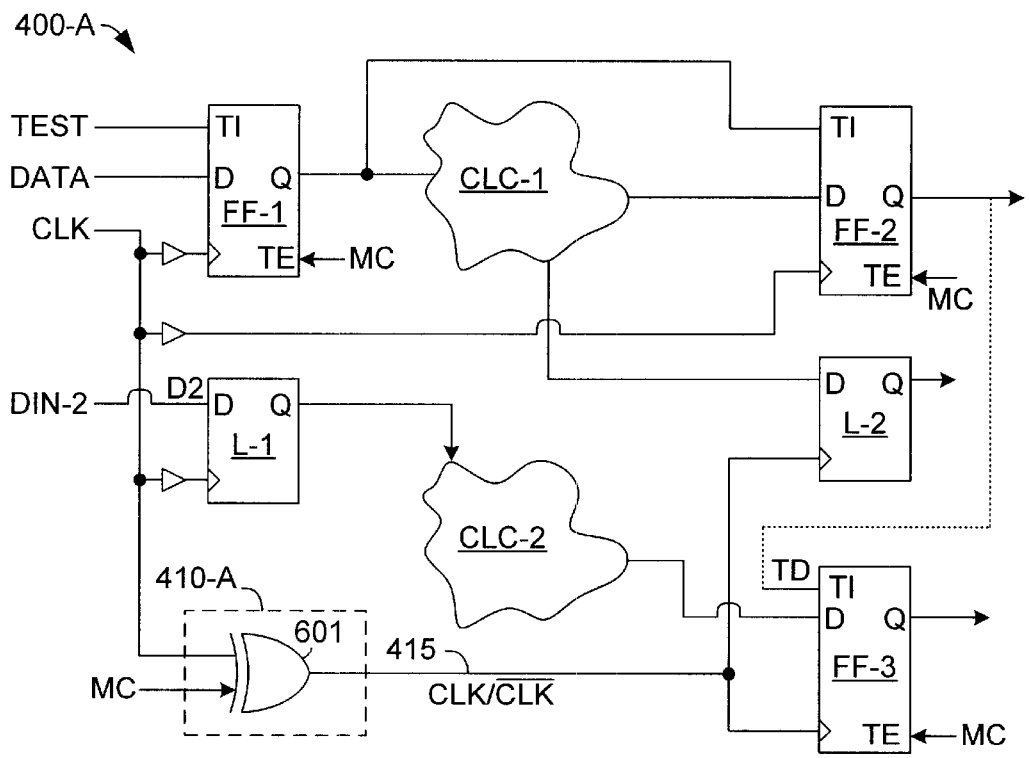
FIGS. 6(A) and 6(B) are simplified circuit diagrams showing integrated circuits having clock signal inverting circuits implemented by an exclusive-OR logic gate and a multiplexer, respectively, according to two embodiments of the present invention.
Figure 6B:
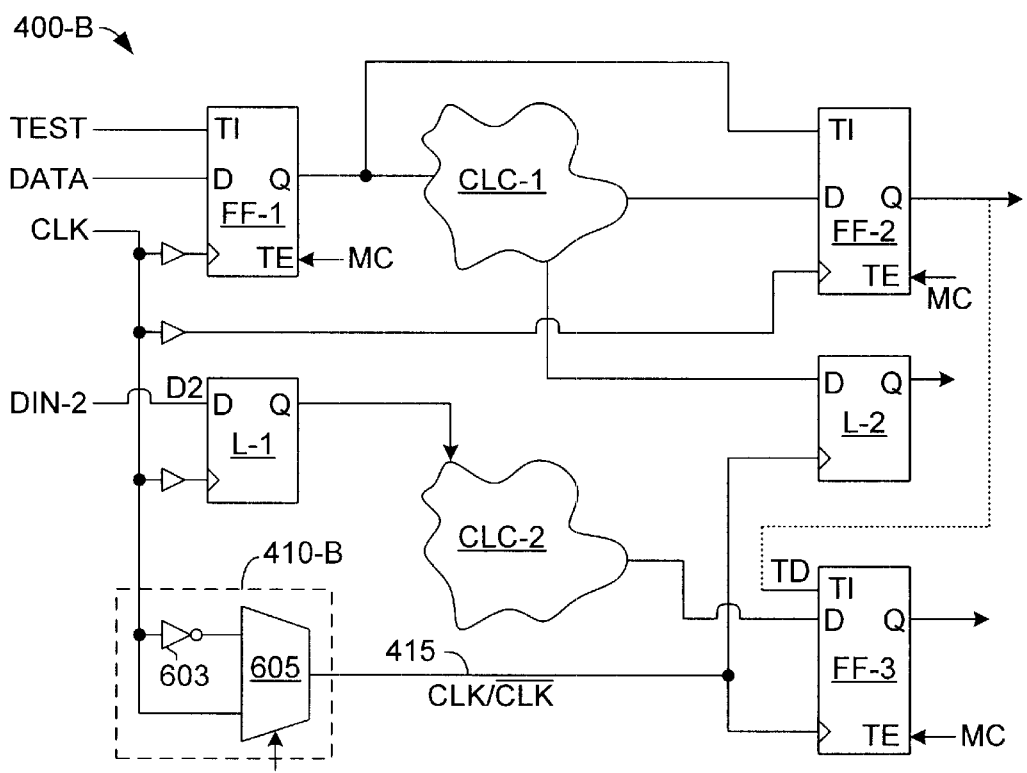

FIGS. 6(A) and 6(B) are simplified circuit diagrams depicting specific embodiments of the clock signal inverting circuit of the present invention. Note that the specific embodiments shown in FIGS. 6(A) and 6(B) are exemplary, and not intended to be limiting.

FIG. 6(A) shows an IC device 400-A according to a first specific embodiment in which a clock signal inverting circuit 410-A is implemented by a two-input exclusive-OR (XOR) gate 601. Mode control signal MC is routed to a first input terminal of XOR gate 601, and clock signal CLK is applied to a second input terminal of XOR gate 601. The output terminal of XOR gate 601, which transmits the CLK/CLK-bar signal, is connected to the clock terminals of all falling edge-triggered circuits (e.g., scan flip-flop FF-3 and latch L-2) via signal path 415. XOR gate 601 is particularly useful for implementing clock signal inverting circuit 410-A because it introduces a minimum number of signal delays to the CLK/CLK-bar signal, while minimizing the amount of space required to generate the inverted clock signal during test modes. In other embodiments, a combination of logic gates can be utilized to perform the same function, but may introduce additional signal delays.

FIG. 6(B) shows an IC device 400-B according to a second specific embodiment in which a clock signal inverting circuit 410-B is implemented by an inverter 603 and a two-to-one multiplexer 605. Inverter 603 inverts clock signal CLK, and applies the inverted clock signal to the first data terminal of multiplexer 605. Clock signal CLK is directly applied to the second data terminal of multiplexer 605. Mode control signal MC is transmitted to select terminal of the multiplexer, and controls which of the two applied clock signals (i.e., the inverted clock signal or the non-inverted clock signal) is passed to the falling edge-triggered circuits. In particular, during test operations, the mode control signal selects the inverted clock signal, which is passed to the falling edge-triggered circuits (e.g., flip-flop F-3 and latch L-2) that are connected to the output terminal of multiplexer 605. During normal operations, the mode control signal selects the (non-inverted) clock signal.

FIGS. 7(A)–7(E) are simplified diagrams depicting a methodology utilized to design ICs including both rising edge and falling edge-triggered circuits according to another embodiment of the present invention. As described above, IC design typically involves a placement and routing procedure during which circuit elements of a desired IC are spatially arranged. In accordance with the current embodiment, the methodology includes modifying the place and route process as described below.

FIG. 7(A) depicts a two-dimensional spatial arrangement including contact pads 701 and elements of the IC device during the place and route portion of an IC design process. The IC elements include a first clocked circuit type (e.g., falling edge-triggered circuits) CT1-1 and CT1-2, a second clocked circuit type (e.g., rising edge-triggered circuits) CT2-1, CT2-2 and CT2-3, and combinational logic circuits CLC-1 and CLC-2. In accordance with the present invention, clock signal inverting circuit (CIC) element 710, which represents clock signal inverting circuit 410 (described above), is included in the list of elements to be placed and routed.

FIG. 7(B) depicts the arrangement of elements following a placement process during which elements of the first clocked circuit type (i.e., CT1-1 and CT1-2) and CIC element 710 are grouped in a selected chip region 720. In one embodiment, the selection of the first clocked circuit type is based upon a comparison process during which the number of first clocked circuits is compared with the number of second clocked circuits, and the circuit type with the lowest number is grouped with clock signal inverting circuit 710. The grouping process is performed by, for example, setting the parameters of the placement tool such that a high cost is assigned to distances separating each of the first clocked circuits and the clock signal inverting circuit 710, thereby biasing the placement tool to group these elements in a smallest possible region. In another example, a high cost is assigned to the nets connecting the output terminal of clock signal inverting circuit 710 and the clock terminals of the first clocked circuits CT1-1 and CT1-2. Those of ordinary skill in the art will recognize that other methods may be utilized to group the selected elements.

FIGS. 7(C), 7(D), and 7(E) depict a routing process in which signal wires are routed between selected contact pads and the various elements of the IC. For example, FIG. 7(C) depicts the formation of a clock signal wire 730 from a selected contact pad to the clock terminals of each of the second clocked circuits CT2-1, CT2-2, and CT2-3, and also to an input terminal of CIC element 710. Similarly, FIG. 7(D) depicts the formation of a signal wire 732 for routing a mode control signal from a selected contact pad to the second input terminal of CIC element 710. Finally, FIG. 7(E) depicts the formation of a clock signal wire 734 from the output terminal of CIC element 710 to the clock terminals of each of the first clocked circuits CT1-1 and CT2-2. Note that the order in which the placement and routing steps are depicted in FIGS. 7(A) through 7(E) is not intended to be limiting. Note also that by grouping the first clocked circuits and CIC element 710 in the smallest possible chip region, clock skew on clock signal line 734 is minimized between CIC element 710 and the first clocked circuits, thereby facilitating scan testing of a maximum amount of an IC circuit using conventional DFT tools.

Although the present invention has been described with respect to certain specific embodiments, it will be clear to those skilled in the art that the inventive features of the present invention are applicable to other embodiments as well, all of which are intended to fall within the scope of the present invention.

What is claimed is:

1. An integrated circuit comprising:
   a first plurality of clocked circuits, each clocked circuit of the first plurality including a first data input terminal and a first clock. terminal connected to receive a clot signal;
   a second plurality of clocked circuits, each clocked circuit of the second plurality including a second data input terminal, and a second clock terminal; and
   a clock signal inverting circuit including a first input terminal connected to receive a clock signal, a second input terminal connected to receive a mode control signal, and an output signal connected to the second clock terminals of each clocked circuit of the second plurality,
   wherein one of the first plurality and second plurality are rising edge-triggered circuits, and the other of the first plurality and second plurality are falling edge-triggered circuits, and
   wherein the clock signal inverting circuit passes the clock signal only to the second plurality of clocked circuits when the mode control signal is in a first state, and inverts the clock signal passed only to the second plurality of clocked circuits when the mode control signal is in a second state.

2. The integrated circuit according to claim 1, wherein said clock signal inverting circuit comprises a two-input logic gate.

3. The integrated circuit according to claim 2, wherein the logic gate is an exclusive-OR logic gate.

4. The integrated circuit according to claim 3, wherein the mode control signal is asserted as a logic 1 during a test mode, and is asserted as a logic zero during a normal operating mode.

5. The integrated circuit according to claim 1, wherein said clock signal inverting circuit comprises a multiplexer and an inverter, wherein the clock signal is applied to a first input terminal of the multiplexer, wherein the inverter is connected between the clock signal and a second data terminal of the multiplexer, and wherein the mode control signal is applied to a select terminal of the multiplexer.

6. The integrated circuit according to claim 1, wherein the first plurality of clocked circuits comprise flip-flops.

7. The integrated circuit according to claim 1, wherein the first plurality of clocked circuits comprises a first scan flip-flop and a second scan flip-flop, each of the first scan flip-flop and the second scan flip-flop having a mode terminal connected to receive the mode control signal.

8. The integrated circuit according to claim 7, wherein the second scan flip-flop includes a scan input terminal connected to a data output terminal of the first scan flip-flop.

9. The integrated circuit according to claim 8, further comprises a combinational logic circuit connected between the data output terminal of the first scan flip-flop and the second data input terminal of the second scan flip-flop.

10. The integrated circuit according to claim 8, wherein the second plurality of clocked circuits comprises a third scan flip-flop having a mode terminal connected to receive the mode control signal, and a scan input terminal connected to a data output terminal of the second scan flip-flop.

11. The integrated circuit according to claim 1, wherein the first plurality of clocked circuits comprises a latch.

12. An integrated circuit controlled by a clock signal, the integrated circuit comprising:
    a plurality of rising edge-triggered flip-flops, each rising edge-triggered flip-flop including a data input terminal, and a clock terminal connected to receive the clock signal;
    a plurality of falling edge-triggered flip-flops, each rising edge-triggered flip-flop including a data input terminal, and a clock terminal; and
    means connected only between the second clock terminal the plurality of falling edge-triggered flip-flops for passing the clock signal to the clock terminal of the falling edge-triggered flip-flops during a normal operating mode, and for inverting the clock signal passed to the falling edge-triggered flip-flops during a test mode.

13. The integrated circuit according to claim 12, wherein said means comprises a two-input logic gate having a first input terminal connected to receive the clock signal and a second input terminal connected to receive a mode control signal.

14. The integrated circuit according to claim 13, wherein the logic gate is an exclusive-OR logic gate.

15. The integrated circuit according to claim 14, wherein the mode control signal is asserted as a logic 1 during a test mode, and is asserted as a logic zero during a normal operating mode.

16. A method for designing an integrated circuit having a first plurality of clocked circuits and a second plurality of clocked circuits, wherein one of the first plurality and second plurality are only rising edge-triggered circuits, and the other of the first plurality and second plurality are only falling edge-triggered circuits, the method comprising:
    placing the integrated circuit such that the first plurality of clocked circuits are grouped in a selected chip region, wherein the integrated circuit includes a clock signal inverting circuit located in the selected chip region;
    generating a routing solution for the integrated circuit including first wiring path for transmitting a clock signal to a clock terminal of each clocked circuit of the second plurality and to a first input terminal of the clock signal inverting circuit, a second wiring path for transmitting a mode control signal to a second input terminal of the clock signal inverting circuit, and a third wiring path for transmitting an output signal from the clock signal inverting circuit to a clock input terminal of each clocked circuit of the first plurality,
    wherein placing and generating the routing solution are performed such that a clock skew generated on the third wiring path between the clock signal inverting circuit and said each clocked circuit of the first plurality is minimized.

17. A method for designing an integrated circuit having a first plurality of clocked circuits and a second plurality of clocked circuits, wherein one of the first plurality and second plurality are rising edge-triggered circuits, and the other of the first plurality and second plurality are falling edge-triggered circuits, the method comprising:

placing the integrated circuit such that the first plurality of clocked circuits are grouped in a selected chip region, wherein the integrated circuit includes a clock signal inverting circuit located in the selected chip region;

generating a routing solution for the integrated circuit including first wiring path for transmitting a clock signal to a clock terminal of each clocked circuit of the second plurality and to a first input terminal of the clock signal inverting circuit, a second wiring path for transmitting a mode control signal to a second input terminal of the clock signal inverting circuit, and a third wiring path for transmitting an output signal from the clock signal inverting circuit to a clock input terminal of each clocked circuit of the first plurality, wherein placing and generating the routing solution are performed such that a clock skew generated on the third wiring path between the clock signal inverting circuit and said each clocked circuit of the first plurality is minimized, and wherein placing comprises comparing a number of clocked circuits of the first plurality with a number of clocked circuits of the second plurality, and selecting the first plurality only if the second plurality is greater than the first plurality.

18. A method for designing an integrated circuit having a first plurality of clocked circuits and a second plurality of clocked circuits, wherein one of the first plurality and second plurality are rising edge-triggered circuits, and the other of the first plurality and second plurality are falling edge-triggered circuits, the method comprising:

placing the integrated circuit such that the first plurality of clocked circuits are grouped in a selected chip region, wherein the integrated circuit includes a clock signal inverting circuit located in the selected chip region;

generating a routing solution for the integrated circuit including first wiring path for transmitting a clock signal to a clock terminal of each clocked circuit of the second plurality and to a first input terminal of the clock signal inverting circuit, a second wiring path for transmitting a mode control signal to a second input terminal of the clock signal inverting circuit, and a third wiring path for transmitting an output signal from the clock signal inverting circuit to a clock input terminal of each clocked circuit of the first plurality, wherein placing and generating the routing solution are performed such that a clock skew generated on the third wiring path between the clock signal inverting circuit and said each clocked circuit of the first plurality is minimized, and wherein the selected chip region defines a smallest region in which the first plurality of clocked circuits and the clock signal inverting circuit can be placed.

* * * * *

UNITED STATES PATENT AND TRADEMARK OFFICE
CERTIFICATE OF CORRECTION

PATENT NO. : 6,529,033 B1
DATED : March 4, 2003
INVENTOR(S) : Heonchul Park et al.

It is certified that error appears in the above-identified patent and that said Letters Patent is hereby corrected as shown below:

Column 3,
Line 14, replace "it" with -- if --.

Column 9,
Line 16, replace "clock." with -- clock --.

Signed and Sealed this

Twenty-first Day of December, 2004

JON W. DUDAS
*Director of the United States Patent and Trademark Office*